United States Patent
Chen et al.

(10) Patent No.: US 7,176,481 B2
(45) Date of Patent: Feb. 13, 2007

(54) IN SITU DOPED EMBEDDED SIGE EXTENSION AND SOURCE/DRAIN FOR ENHANCED PFET PERFORMANCE

(75) Inventors: Huajie Chen, Danbury, CT (US); Dureseti Chidambarrao, Weston, CT (US); Siddhartha Panda, Beacon, NY (US); Sang-Hyun Oh, Santa Barbara, CA (US); Henry K. Utomo, Poughkeepsie, NY (US); Werner A. Rausch, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,598

(22) Filed: Jan. 12, 2005

(65) Prior Publication Data

US 2006/0151837 A1    Jul. 13, 2006

(51) Int. Cl.
*H01L 29/06*        (2006.01)
(52) U.S. Cl. ..................... 257/19; 257/63; 257/347
(58) Field of Classification Search ............ 257/57, 257/192, 337, 338, 351, 369, 371, 18, 19, 257/63, 347
See application file for complete search history.

(56) References Cited

U.S. PATENT DOCUMENTS

| 6,621,131 | B2 | 9/2003 | Murthy et al. | |
| 6,893,919 | B2* | 5/2005 | Chuang et al. | 438/257 |
| 6,906,360 | B2* | 6/2005 | Chen et al. | 257/204 |
| 6,991,972 | B2* | 1/2006 | Lochtefeld et al. | 438/149 |
| 6,995,456 | B2* | 2/2006 | Nowak | 257/627 |
| 2005/0029601 | A1* | 2/2005 | Chen et al. | 257/369 |
| 2005/0093076 | A1* | 5/2005 | Steegen et al. | 257/369 |
| 2006/0057859 | A1* | 3/2006 | Chen | 438/765 |

* cited by examiner

*Primary Examiner*—Thao X. Le
*Assistant Examiner*—Mursalin B. Hafiz
(74) *Attorney, Agent, or Firm*—Gibb I.P. Law Firm, LLC; Todd M.C. Li, Esq.

(57) ABSTRACT

Disclosed is an integrated circuit structure and a method of making such a structure that has a substrate and P-type and N-type transistors on the substrate. The N-type transistor extension and source/drain regions comprise dopants implanted into the substrate. The P-type transistor extension and source/drain regions partially include a strained epitaxial silicon germanium, wherein the strained silicon germanium comprises of two layers, with a top layer that is closer to the gate stack than the bottom layer. The strained silicon germanium is in-situ doped and creates longitudinal stress on the channel region.

28 Claims, 8 Drawing Sheets

US 7,176,481 B2

IN SITU DOPED EMBEDDED SIGE EXTENSION AND SOURCE/DRAIN FOR ENHANCED PFET PERFORMANCE

FIELD OF THE INVENTION

The invention generally relates to an integrated circuit structure that has P type and N type transistors where strained silicon germanium in the P type extension and source/drain regions creates longitudinal stress on the channel region of the P type transistors.

DESCRIPTION OF THE RELATED ART

U.S. Pat. No. 6,621,131 to Murthy (hereinafter "Murthy") discloses embodiments that were satisfactory for the purposes for which they were intended. The disclosure of Murthy, in its entirety, is hereby expressly incorporated by reference into the present invention for purposes including, but not limited to, indicating the background of the present invention and illustrating the state of the art. It has been shown that the strain in the silicon channel can affect the mobility of CMOS transistor carriers significantly. Compressive longitudinal stress along the channel is known to help the PFET (P-type field effect transistor) drive current while it degrades the NFET (N-type field effect transistor) performance. There have been many proposals to improve both NFET and PFET device performance using tensile and compressive longitudinal stresses, respectively, which include modulating middle of line (MOL) nitride liner and spacer intrinsic stresses and STI (shallow trench isolation) material changes individually for the two MOSFETs (metal oxide semiconductor field effect transistors) using masks. The stress state in the channel that can be imposed by any of these approaches is typically a few hundred MPa.

Another approach is to use SiGe-based strained silicon substrates where SiGe is used as part of the whole substrate. When silicon is grown epitaxially on the "relaxed" SiGe layer, a tensile strain results in the Si, which improves electron mobility. Hole mobility is more difficult to enhance in this approach since a very large Ge percentage is required.

SUMMARY OF THE INVENTION

The invention presents a method of forming transistors and a resulting structure. The invention begins by forming shallow trench isolations (STI), well implants and anneals, and then forming gate stacks for P-type and N-type transistors on a substrate. Following gate stack formation, typical implants for Vt adjustment, Halo, extension and source/drain are carried out, with typical spacer formation for related implants, followed by dopant activation anneal. Then, the first-type transistors are protected, and upper proportions of the second-type transistor source/drain regions are removed using etching to create openings adjacent the gate stacks of the second-type transistors.

This etching process first performs isotropic or semi-isotropic etching on the P-type transistor extension and source/drain regions, which has large lateral to vertical etch ratio, and, after the first etching, performs anisotropic or semi-isotropic etching on the P-type transistors extension and source/drain regions, which has smaller lateral etch. This creates an undercut below the spacers of the P-type transistors such that a portion of the spacers of the P-type transistors overhangs the openings.

Then, the invention epitaxially grows strained silicon germanium in the openings. A portion of the substrate below the gate stacks of the P-type transistors comprises a channel region and the strained silicon germanium creates longitudinal stress on the channel region. The process of epitaxially growing the strained silicon germanium is a selective epitaxy process and can be in-situ doped with boron. The invention uses protective caps over the gate stacks of the P-type transistors to protect gates of the P-type transistors during the process of removing the upper portions of the P-type transistors extension and source/drain regions and prevent growth on the gates during subsequent SiGe epitaxy process.

This produces an integrated circuit structure that has a substrate and P-type and N-type transistors on the substrate. The N-type transistor extension and source/drain regions comprise dopants implanted into the substrate. The P-type transistor extension and source/drain regions can partially include Boron doped strained epitaxial silicon germanium. Instead of boron, any appropriate impurity whether now known or developed in the future can be used with the invention and boron is only used as an example herein. The strained silicon germanium creates longitudinal stress on the channel region. The strained epitaxial silicon germanium comprises two layers, with the top layer being closer to the gate stack than the bottom layer.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
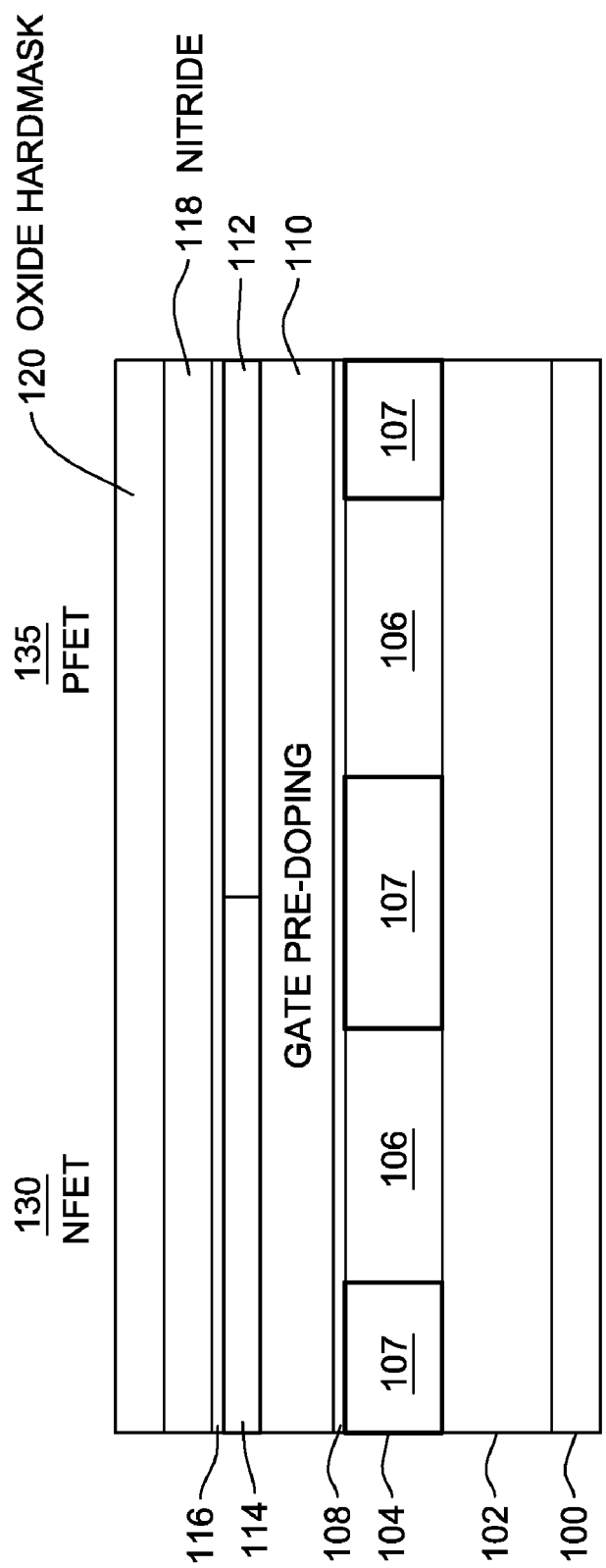
FIG. 1 is a cross-sectional schematic diagram of a partially completed integrated circuit structure according to the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Referring now to the drawings, FIG. 1-7 illustrate one embodiment of the invention. In FIG. 1, item 100 represents a silicon substrate, and item 102 represents a buried oxide (BOX). Layer 104 is a silicon on insulator (SOI) layer that has shallow trench isolation (STI) region 107 formed therein, and remaining Si regions 106 that are doped with well implants accordingly for PFET and NFET. The top thin layer of regions 106 will become the channels of the transistors. Layer 108 is an oxide layer that will become the gate oxides for the different transistors. Gate oxides of different thickness may be formed on the same chip by using multiple steps of oxidation, masking and etching. Layer 110 represents a gate conductor (polysilicon, metal, alloy, etc.) of the transistors, and the top part of layer 110 has gate predoping implants (denoted as layer 112/114), for NFETs and PFETs, respectively. Layer 116 is an oxide, which is optional, layer 118 is a nitride, and layer 120 is an oxide hard mask. In the case where a soft mask process is used, then layer 120 is not necessary. The portion of the structure shown on the left side of FIG. 1 will become an N-type field effect transistor (NFET) 130 and the structure shown on the right side of FIG. 1 will become a P-type field effect transistor (PFET) 135. Therefore, the gate doping 112, 114, and the well region doping 106 will be different for the different types of transistors. The different methodologies and materials that could be used to form the structure shown in FIG. 1 are well-known to those ordinarily skilled in the art (see Murthy) and a detailed discussion of such methodologies is avoided herein so as to focus the reader's attention upon the salient features of the invention.

Figure 2:
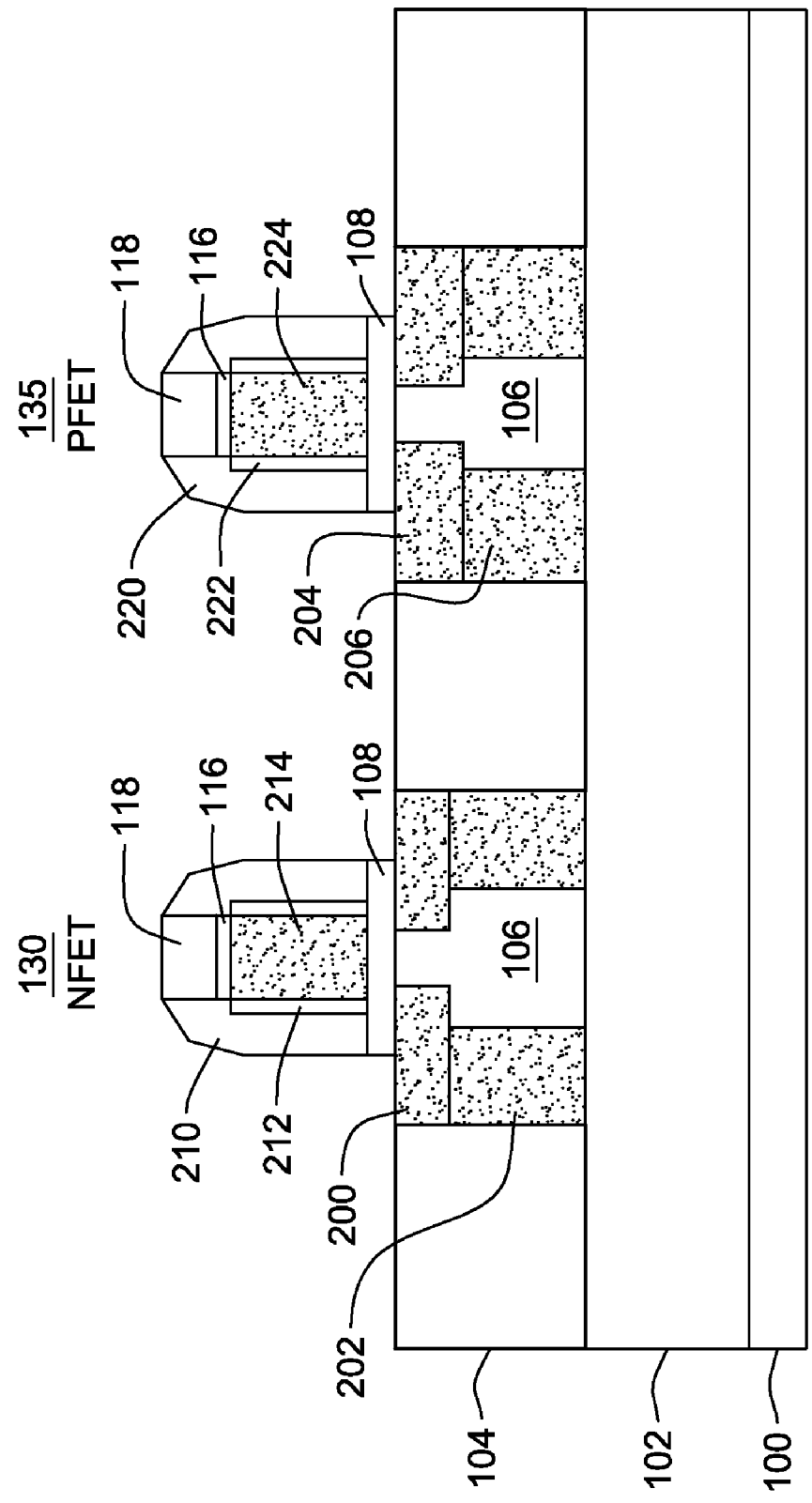
FIG. 2 is a cross-sectional schematic diagram of a partially completed integrated circuit structure according to the invention.

In FIG. 2, the gate stack structures are formed using well-known processing steps. With the invention, the nitride layer 118 covers the gate stacks, which prevents SiGe growth on the gate during epitaxy. Thin thermal oxides 212, 222 are then grown on the exposed areas of the polysilicon gate 214. In addition, sidewall spacers 210, 220 are formed along the sidewalls of the gate conductors. The source/drain regions and extensions 200, 202, 204, 206 for the NFET 130 and PFET 135 type devices utilize different doping materials/concentrations, as is well known to those ordinarily skilled in the art. Other implants that may be performed include Vt adjustment implants, Halo implants, etc. The dopants in the pre-doping layer 112, 114 are diffused down to the bottom of gate 110 after the source/drain activation anneal, to form the gate conductors 214, 224. The dopant implant into the PFET source/drain will be etched and in-situ boron doped, and SiGe will be grown therein. A simple spacer process used an example here, but other more complex spacer schemes may be employed, such as using spacers for Halo/Extension implant, and multiple spacers for source/drain implants. Then, some of the multiple spacers may be removed so as to bring the recess and SiGe epitaxy closer to the gate stack in the following steps.

Figure 3:
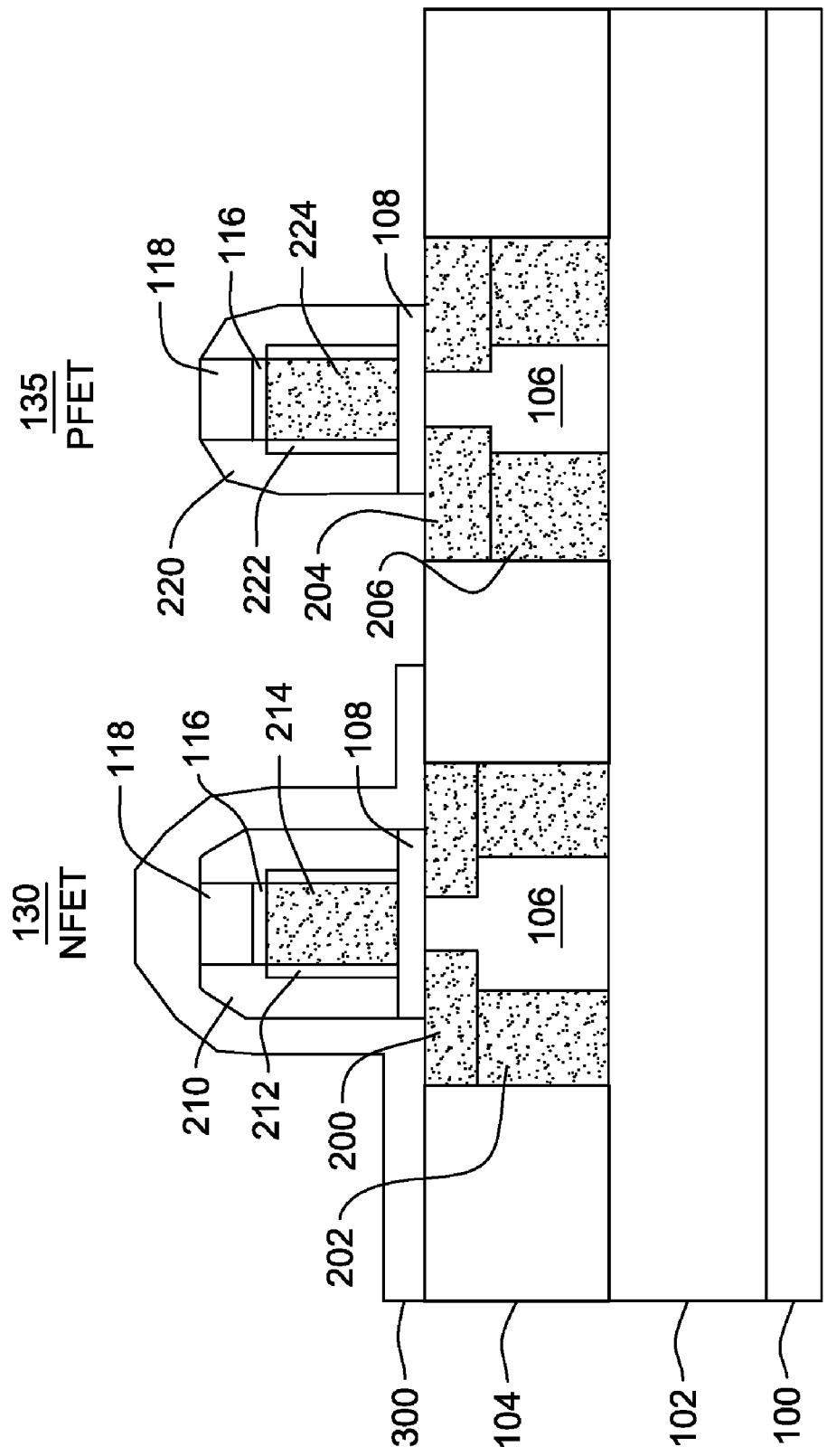
FIG. 3 is a cross-sectional schematic diagram of a partially completed integrated circuit structure according to the invention.
Figure 4:
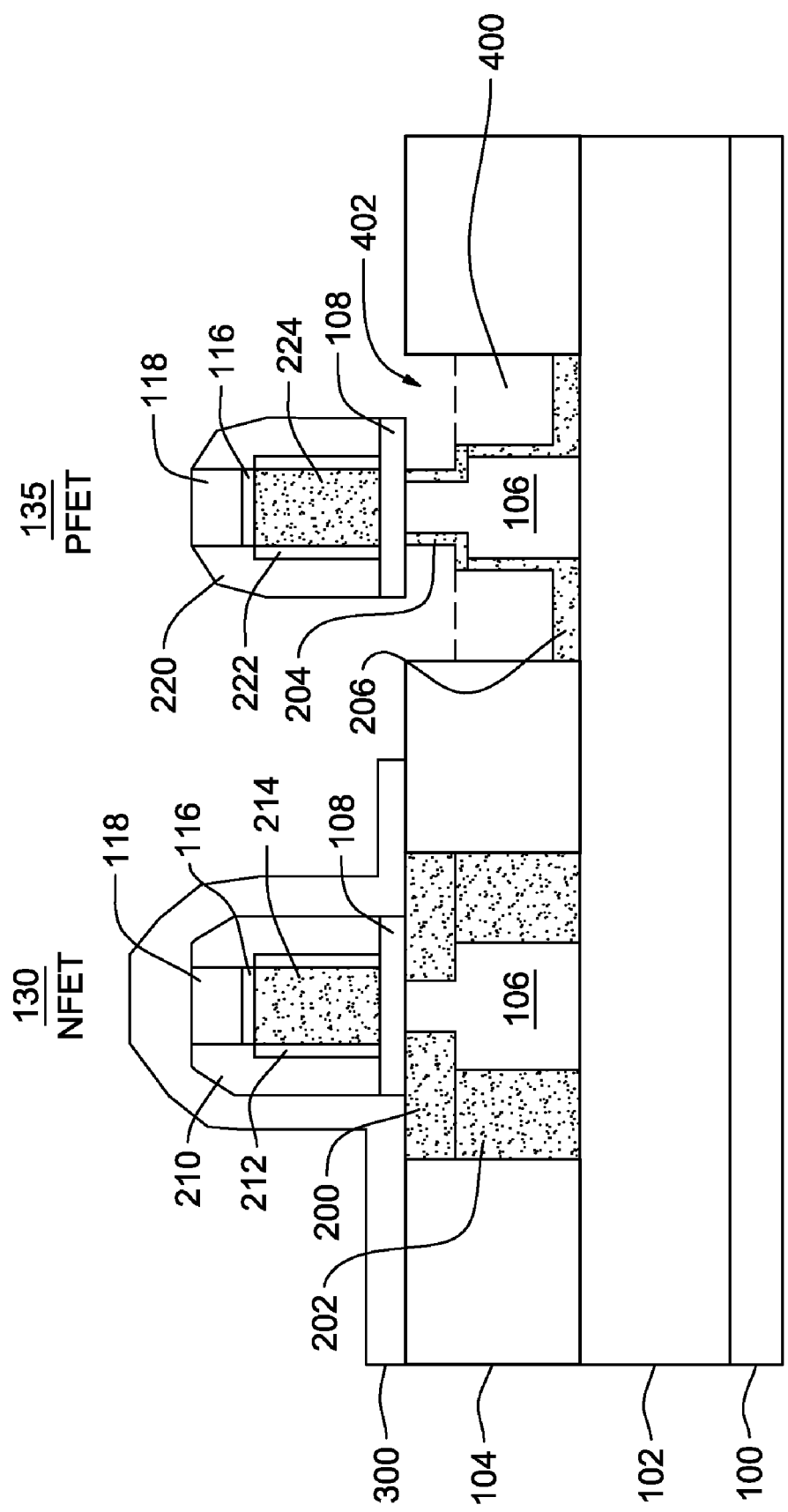
FIG. 4 is a cross-sectional schematic diagram of a partially completed integrated circuit structure according to the invention.

In FIG. 3, a protective covering 300 is formed over the NFET structure 130 using well-known patterning techniques. Layer 300 may be an oxide layer or nitride layer. In the processing shown in FIG. 4, the invention performs a multiple step etching process to create openings in the extension and source/drain regions 204, 206 of the PFET structures 135. More specifically, the invention first performs isotropic or semi-isotropic etching on the PFET 135 extension and source/drain regions 204, 206, which has large lateral to vertical etch ratio (etches at a higher rate laterally than vertically). This forms the initial openings 402 in extension and source/drain regions 204, 206. After the first etching, the invention then performs a second anisotropic or semi-isotropic etching on the source/drain regions 206 to deepen the openings as shown by item 400, but with smaller lateral etch. In the case where the second etch is semi-isotropic, the opening 402 is further etched by this semi-isotropic etching.

A portion of the originally doped extension and source/drain region 204, 206 remains in the structure after the first and second etching, so that epitaxial interface of silicon germanium and silicon is within the extension and source/drain region, to control the junction leakage and short channel effect. At the same time, this remaining portion of the source/drain region 204, 206 is to be minimized within the control of etch processes and the extension and source/drain formation processes, so that the SiGe is closer to the gate stack. This requirement determines the lateral to vertical etch ratio and the etch amount of the first and second etch.

Figure 5:
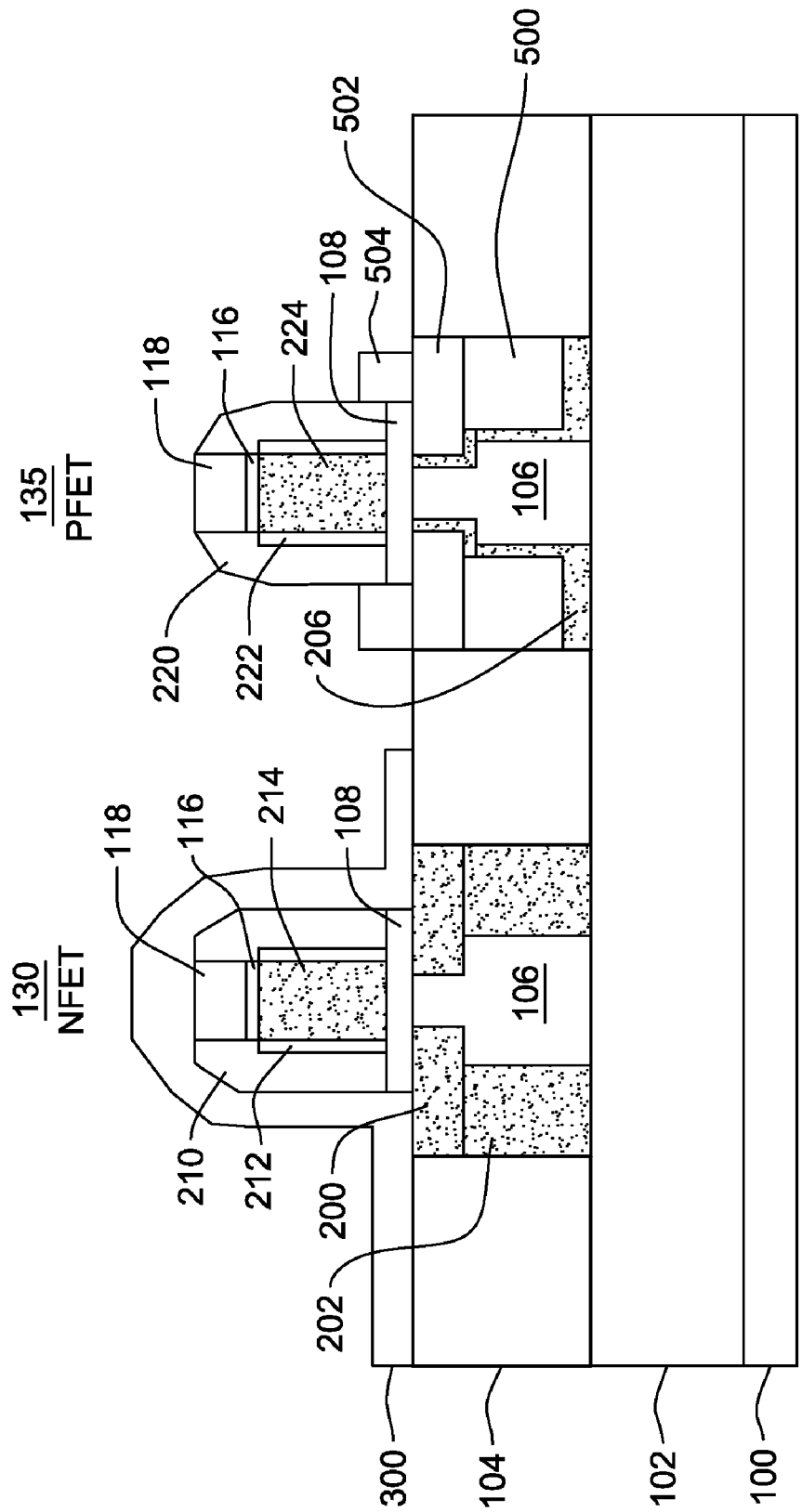
FIG. 5 is a cross-sectional schematic diagram of a partially completed integrated circuit structure according to the invention.

Next, as shown in FIG. 5, silicon germanium 500, 502, 504 is epitaxially grown in the openings 400, 402. Instead of silicon germanium, any strain producing material whether now know or developed in the future can be used with the invention, and silicon germanium is only used as an example. This can be done in multiple steps or continuously. Item 500 represents the portion of the silicon germanium that fills the opening 400; item 502 represents the portion of the silicon germanium that fills openings 402; and item 504 represents additional silicon germanium that is grown above the openings 400, 402 and above the top of the substrate 104. Item 504 is optional. While the silicon germanium is illustrated using three different identification numbers 500, 502, 504, as would be understood by one ordinarily skilled in the art, region 500, 502, 504 could comprise a continuous and uninterrupted layer of silicon germanium.

The process of epitaxially growing the silicon germanium in FIG. 5 comprises a selective epitaxy process, which grows silicon germanium on the exposed silicon surface, but does not SiGe grow on dielectric layers, such as nitride or oxide. Also, this epitaxial process can be done in the presence of an appropriate dopant impurity (such as boron), such that the silicon germanium grows with the dopant included therein, without there being a need to implant additional dopants later in subsequent processing. Instead of boron, any appropriate impurity whether now known or developed in the future can be used with the invention and boron is only used as an example herein. Therefore, the silicon germanium 500, 502, 504 is referred to as an in-situ doped layer. The Ge concentration in the SiGe film can be 10–50%, and more precisely 15–30%. The boron doping level in the SiGe can be larger than $1 \times 10^{20}/cm^3$.

As is understood by those ordinarily skilled in the art, epitaxially grown silicon germanium is pseudomorphic to the silicon substrate and hence compressively strained, when the Ge concentration and thickness is chosen so that the film does not relax at the epitaxy temperature and subsequent process steps. This compressively strained SiGe in the extension and source/drain apply longitudinal stress to the channel region. As explained above, by straining the channel region, the performance of the PFET is substantially improved. Further, by first undercutting the opening 402 beneath the spacers, the silicon germanium 502 is formed very close to the channel region to maximize the stress that is applied to the channel region, and reduce the extension resistance as boron doped SiGe has lower resisitivity than Si. This maximizes the performance of the PFET device 135. However, lateral etching of layer 400 is limited so as to make sure the SiGe/Si interface is within the implanted source/drain, so as to control the junction leakage and short channel effect.

Figure 6:
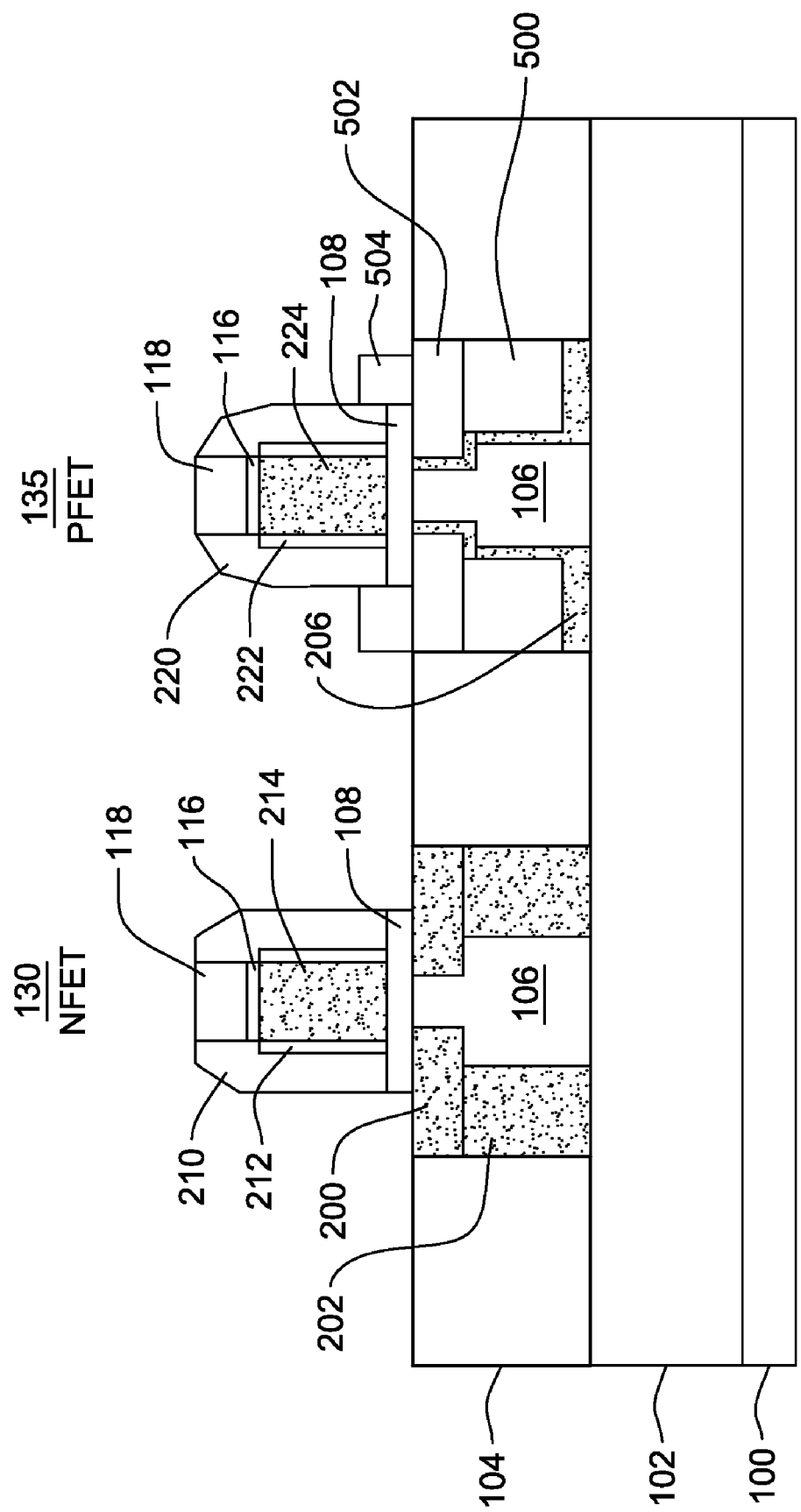
FIG. 6 is a cross-sectional schematic diagram of a partially completed integrated circuit structure according to the invention.
Figure 7:
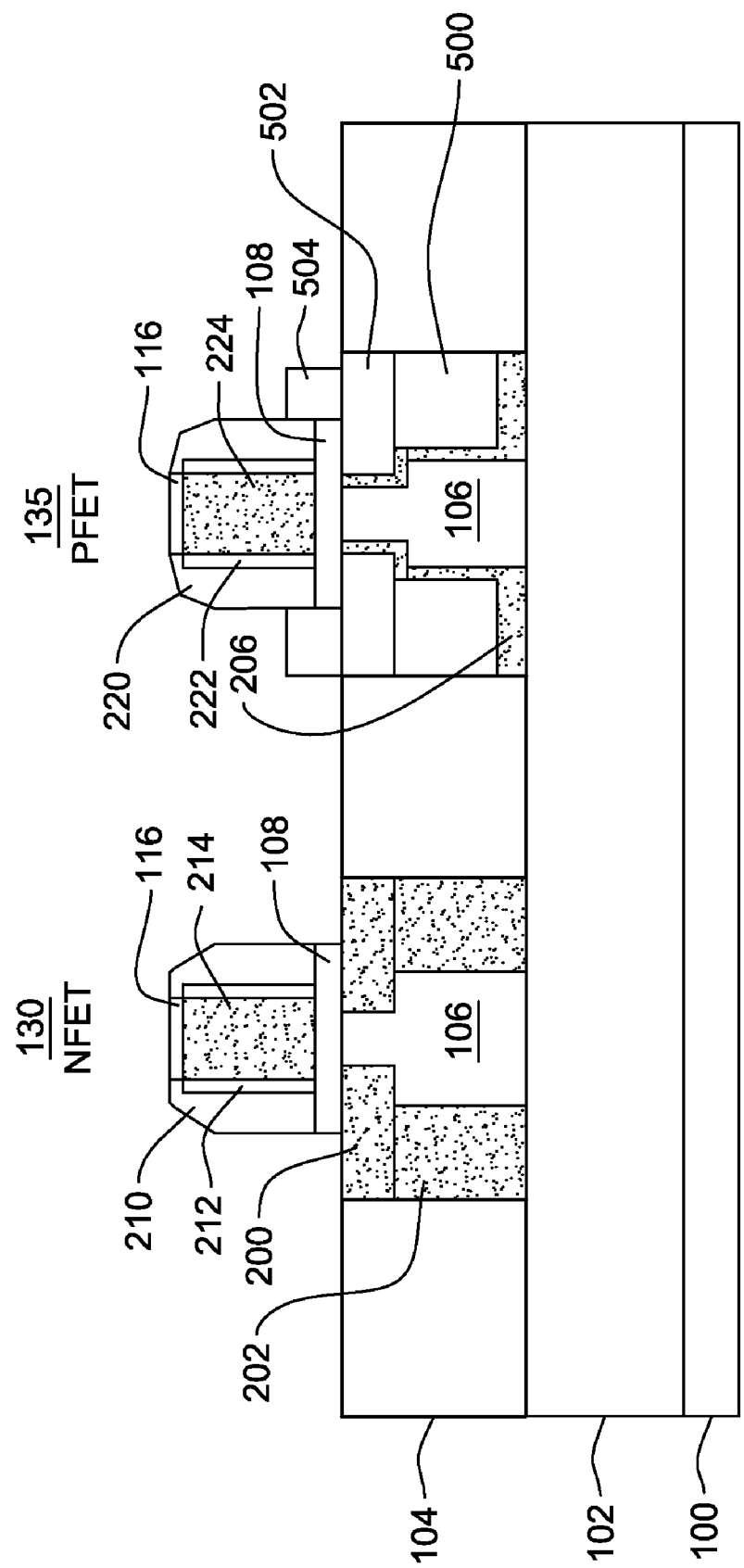
FIG. 7 is a cross-sectional schematic diagram of a partially completed integrated circuit structure according to the invention.

FIGS. 6–7 illustrate processing steps to complete the structure. More specifically, in FIG. 6, the protective layer 300 is removed. HF etch can be used if layer 300 is an oxide layer. Then a nitride RIE process selective to silicon and SiGe can be used to remove the nitride cap layer 118. Alternatively, a hot phosphorous acid etch can be used to remove nitride layer 118 and spacers 210 and 220, and then form a new spacer for silicide. If layer 300 is nitride, then the removal of layer 300 and 118 can be combined in one step. The processing shown in FIGS. 6–7 can comprise any number of well-known material removal steps as will be understood by one ordinarily skilled in the art in light of this disclosure. The oxide layer 116 is removed during silicide preclean. Then, typical Ni silicide and multiple levels of metal contacts and interconnects can be formed, as well known to one ordinarily skilled in the art.

Figure 8:
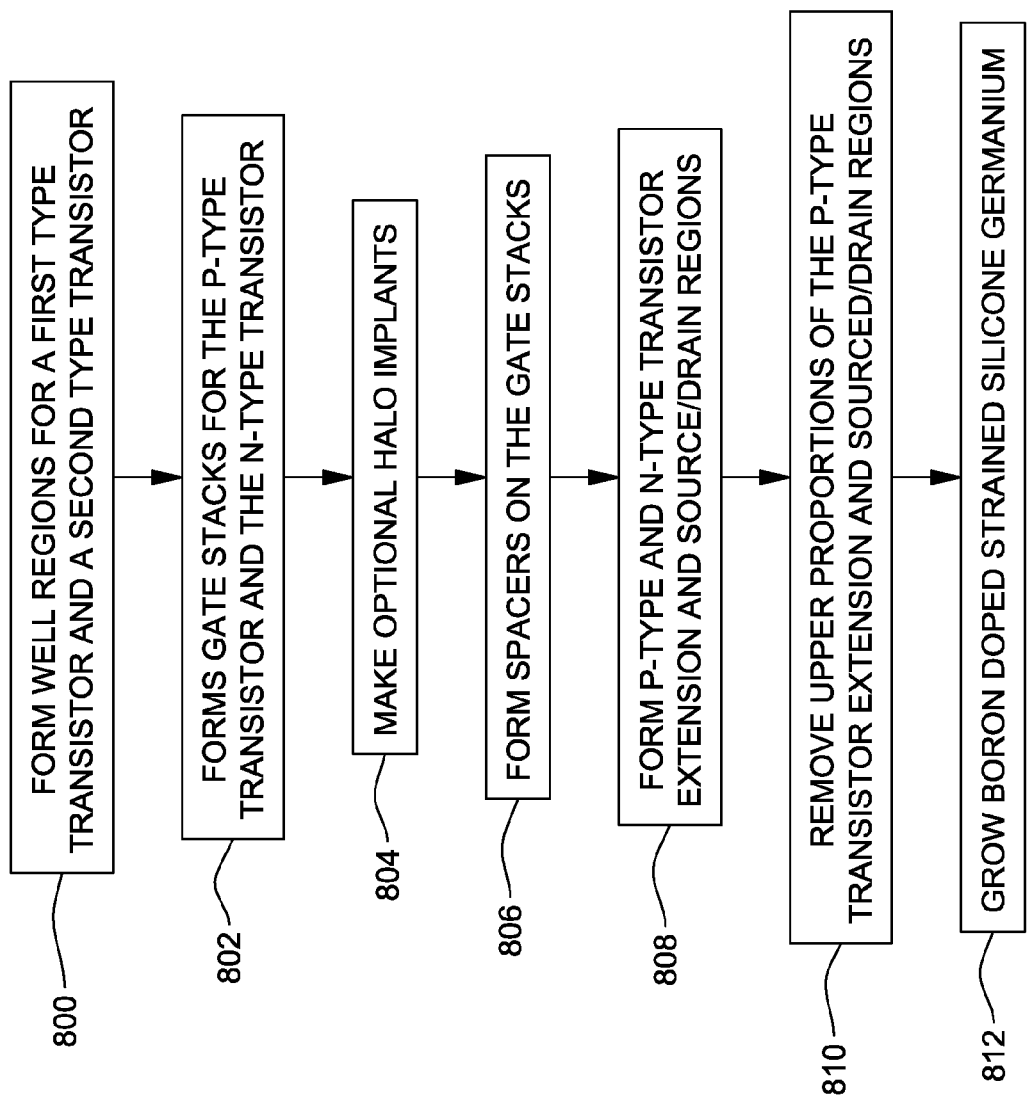
FIG. 8 is a flow chart illustrating one embodiment of the invention.

FIG. 8 shows the inventive method of forming transistors in an integrated circuit structure in flowchart form. In item 800, the invention forms well regions for a first type (e.g., N-type) transistor and a second-type (e.g., P-type) transistor in a substrate, and in item 802, forms gate stacks for the P-type transistor and the N-type transistor on the substrate. Then, optional halo implants can be made in item 804. Next, spacers are formed on the gate stacks in item 806 before doping areas of the substrate adjacent the gate stacks accordingly to form the P-type transistor extension and source/drain regions and the N-type transistor extension and source/drain regions in item 808. Then, upper proportions of the P-type transistor extension and source/drain regions are removed to create openings adjacent the gate stack of the P-type transistor using a two step etching process, in item 810, such that a top portion of the opening extends under the P-type gate stack more than a bottom portion of the opening. The spacers can be used as a masking layer for removing the upper proportions of the P-type transistor extension and source/drain regions. Then, the boron doped strained silicon germanium is grown in the openings by selective epitaxy process 812. Again, the strained silicon germanium creates longitudinal stress on the well region of P-type transistor.

The stress produced with the invention is longitudinal and compressive and causes hole mobility enhancements. The compressive stress inherent from the embedded SiGe 500, 502, 504 can cause significant compression in the channel. This longitudinal stress can enhance hole mobility considerably. This invention has added the benefit of higher boron activation with the in-situ boron doped epitaxial SiGe compared with implant and annealed Si. By using a two step etching, the amount of in-situ doped SiGe in the extension is increased so as to reduce extension resistance, and the distance of SiGe in the extension and source/drain to the gate channel is reduced so as to increase the stress in the channel, while still contain the whole SiGe in the implant formed extension and source/drain region so that junction leakage and short channel effect is controlled.

While the invention has been described in terms of embodiments, those skilled in the art will recognize that the invention can be practiced with modification within the spirit and scope of the appended claims. For example, different materials for covering gates and NFET and the different removal processes can be used. While a SOI substrate is used in the embodiments shown, the invention is equally applicable to bulk silicon substrates. In the preferred embodiment, silicon recess and SiGe epitaxy is done after the source/drains are formed and dopant activation anneal is already carried out. It is also possible to do the silicon recess and in-situ boron doped SiGe epitaxy in between extension implant and dopant activation anneal. The same advantage can be obtained, with the consideration given to the fact that B will diffuse out from SiGe during dopant activation anneal and hence adjusting the amount of lateral etching. In this integration scheme, the source/drain implant for PFET may be omitted, and source/drain is formed by B in the SiGe and B diffused out from the SiGe.

What is claimed is:

1. An integrated circuit transistor structure comprising:
   a substrate;
   an N-type transistor having an N-type gate stack on said substrate and N-type source and drain region extension and source/drain regions in said substrate adjacent said N-type gate stack;
   a P-type transistor having a P-type gate stack on said substrate and P-type source and drain region extension and source/drain regions in said substrate adjacent said P-type gate stack;
   wherein said P-type source and drain region extension and source/drain regions partially include a boron doped strained silicon germanium, wherein said P-type source and drain region extension extends along and under said strained silicon germanium, and
   wherein said strained silicon germanium comprises two portions, wherein a top portion of said strained silicon germanium extends under said P-type gate stack more than a bottom portion of said strained silicon germanium.

2. The structure in claim 1, further comprising a channel region in said substrate below said P-type gate stack, wherein said strained silicon germanium creates longitudinal stress on said channel region of P-type transistor.

3. The structure in claim 2, where said strained silicon germanium is separated from said channel region of said P-type transistor.

4. The structure in claim 1, where germanium concentration in said strained silicon germanium is between about 10% and 50%.

5. The structure in claim 1, where boron concentration in said strained silicon germanium is more than about $1 \times 10^{20}/cm^3$.

6. The structure in claim 1, wherein said strained silicon germanium is in-situ doped with said boron.

7. The structure in claim 1, wherein said strained silicon germanium extends above the top of said substrate.

8. An integrated circuit transistor structure comprising:
   a substrate;
   an first-type transistor having an first-type gate stack on said substrate and first-type source and drain extension and source/drain regions in said substrate adjacent said first-type gate stack;

a second-type transistor having a second-type gate stack on said substrate and second-type source and drain region extension and source/drain regions in said substrate adjacent said second-type gate stack;

wherein said second-type source and drain region extension and source/drain regions partially include strained silicon, wherein said second-type extension extends alone and under said strained silicon germanium, and wherein said strained silicon comprises two portions, wherein a top portion of said strained silicon extends under said second-type gate stack more than a bottom portion of said strained silicon.

9. The structure in claim 8, further comprising a channel region in said substrate below said second-type gate stack, wherein said strained silicon creates longitudinal stress on said channel region of second-type transistor.

10. The structure in claim 9, where said strained silicon is separated from said channel region of said second-type transistor.

11. The structure in claim 8, where germanium concentration in said strained silicon is between about 10% and 50%.

12. The structure in claim 8, where boron concentration in said strained silicon is more than about $1 \times 10^{20}/cm^3$.

13. The structure in claim 8, wherein said strained silicon is in-situ doped with an impurity.

14. The structure in claim 8, wherein said strained silicon extends above the top of said substrate.

15. An integrated circuit transistor structure comprising:
a substrate;
an N-type transistor having an N-type gate stack on said substrate and N-type source and drain region extension and source/drain regions in said substrate adjacent said N-type gate stack;
a P-type transistor having a P-type gate stack on said substrate and P-type source and drain region extension and source/drain regions in said substrate adjacent said P-type gate stack;
wherein said P-type source and drain region extension and source/drain regions partially include a boron doped strained silicon germanium, wherein said P-type source and drain region extension extends along and under said strained silicon germanium, and
wherein said strained silicon germanium comprises two portions, wherein a top portion of said strained silicon germanium extends under said P-type gate stack more than a bottom portion of said strained silicon germanium and wherein said silicon germanium top portion extends above a top surface of said substrate.

16. The structure in claim 15, further comprising a channel region in said substrate below said P-type gate stack, wherein said strained silicon germanium creates longitudinal stress on said channel region of P-type transistor.

17. The structure in claim 16, where said strained silicon germanium is separated from said channel region of said P-type transistor.

18. The structure in claim 15, where germanium concentration in said strained silicon germanium is between about 10% and 50%.

19. The structure in claim 15, where boron concentration in said strained silicon germanium is more than about $1 \times 10^{20}/cm^3$.

20. The structure in claim 15, wherein said strained silicon germanium is in-situ doped with said boron.

21. The structure in claim 15, wherein said strained silicon germanium extends above the top of said substrate.

22. An integrated circuit transistor structure comprising:
a substrate;
an first-type transistor having an first-type gate stack on said substrate and first-type source and drain region extension and source/drain regions in said substrate adjacent said first-type gate stack;
a second-type transistor having a second-type gate stack on said substrate and second-type source and drain region extension and source/drain regions in said substrate adjacent said second-type gate stack;
wherein said second-type source and drain region extension and source/drain regions partially include strained silicon, wherein said second-type source and drain region extension extends along and under said strained silicon germanium, and
wherein said strained silicon comprises two portions, wherein a top portion of said strained silicon extends under said second-type gate stack more than a bottom portion of said strained silicon and wherein said silicon germanium top portion extends above a top surface of said substrate.

23. The structure in claim 22, further comprising a channel region in said substrate below said second-type gate stack, wherein said strained silicon creates longitudinal stress on said channel region of second-type transistor.

24. The structure in claim 23, where said strained silicon is separated from said channel region of said second-type transistor.

25. The structure in claim 22, where germanium concentration in said strained silicon is between about 10% and 50%.

26. The structure in claim 22, where boron concentration in said strained silicon is more than about $1 \times 10^{20}/cm^3$.

27. The structure in claim 22, wherein said strained silicon is in-situ doped with an impurity.

28. The structure in claim 22, wherein said strained silicon extends above the top of said substrate.

* * * * *